United States Patent [19]
Gau

[11] Patent Number: 6,071,804
[45] Date of Patent: Jun. 6, 2000

[54] METHOD OF FABRICATING BIT LINES BY DAMASCENE

[75] Inventor: Jing-Horng Gau, Hsien, Taiwan

[73] Assignee: United Semiconductor Corp., Hsinchu, Taiwan

[21] Appl. No.: 09/206,112

[22] Filed: Dec. 4, 1998

[30] Foreign Application Priority Data

Sep. 19, 1998 [TW] Taiwan ................................. 87115641

[51] Int. Cl.[7] .............................................. H01L 21/4763
[52] U.S. Cl. ......................... 438/618; 438/617; 438/500; 437/300
[58] Field of Search .................................. 438/618, 500, 438/617; 437/300

[56] References Cited

U.S. PATENT DOCUMENTS 5,691,238  11/1997  Avanzino et al. ..................... 437/195
5,693,568  12/1997  Liu et al. ............................... 437/618
5,893,748  2/1997   Lin ........................................ 438/618

*Primary Examiner*—Richard Elms
*Assistant Examiner*—Pho Luu
*Attorney, Agent, or Firm*—J. C. Patents; Jiawei Huang

[57] ABSTRACT

A method of fabricating bit lines by damascene. A substrate having a first dielectric layer is provided, and a bit line contact is formed within the first dielectric layer. A hard material layer is formed on the first dielectric layer to expose the bit line contact. A second dielectric layer is formed on the hard material layer. An opening and a trench are formed within the second dielectric layer to expose the bit line contact and the hard material layer. A hard material spacer is formed on the sidewall of the opening and the trench. A tungsten silicide layer fills the opening and the trench to serve as a bit line on the bit line contact and an interconnect of the bit line.

12 Claims, 5 Drawing Sheets

METHOD OF FABRICATING BIT LINES BY DAMASCENE

CROSS-REFERENCE TO RELATED APPLICATION

This application claims priority benefit of Taiwan application Ser. No. 87115641, filed Sep. 19, 1998, the full disclosure of which is incorporated herein by reference.

BACKGROUND OF THE INVENTION

1. Field of the Invention

The invention relates to a method of fabricating bit lines, and more particularly to a method of fabricating bit lines by damascene.

2. Description of the Related Art

FIGS. 1A–1D shows a fabricating method of bit lines in prior art. Referring to FIG. 1A. an oxide layer 102 is formed on the substrate 100 and the oxide layer 102 is patterned by photolithography to form a bit line contact window 104. A polysilicon layer 106 and a tungsten silicide layer (WSi$_x$) 108 are formed successively on the substrate 100 to fill the bit line contact window 104, as shown in FIG. 1B. The steps of exposure, development and etching are performed to define the polysilicon layer 106 and the tungsten silicide layer 108 to form a bit line including bit line contacts 110 and interconnects 112 which connect each of the bit line contacts 110, as shown in FIG. 1C. An oxide layer 114 is deposited over the substrate 100, as shown in FIG. 1D, and a node contact window (not shown) is then subsequently defined.

FIG. 2 is a top view of FIG. 1D. Generally, in order to increase the alignment space of the node contact 200 and avoid to contact with the bit line 110$b$ on the bit line contact 110$a$, the critical dimension (CD) of the interconnect 112 of bit line 204 is narrower. The width of the interconnect 112 should be narrowed as the size of the device is reduced. It is difficult to perform a exposure process to achieve the requirement of reduced width of interconnect 112. The alignment space between the interconnects 112 for the node contact 200 is not large enough to form the node contact 200. If the node contact 200 is misaligned, it maybe contact with the interconnects 112 to cause shorts between the node contact 200 and the interconnects 112.

SUMMARY OF THE INVENTION

It is therefore an object of the invention to provide a method of fabricating bit lines by damascene to reduce the width of the bit lines, such that the aligned space for the node contact can be increased and the error during the step of alignment is therefore reduced.

To achieve these objects and advantages, and in accordance with the purpose of the invention, as embodied and broadly described herein, the invention is directed towards a method of fabricating bit lines by damascene. A substrate having a first dielectric layer is provided and a bit line contact is formed within the first dielectric layer. A hard material layer is formed on the first dielectric layer to expose the bit line contact. A second dielectric layer is formed on the hard material layer. An opening and a trench are formed within the second dielectric layer to expose the bit line contact and the hard material layer. A hard material spacer is formed on the sidewall of the opening and the trench. A tungsten silicide layer fills the opening and the trench to serve as a bit line on the bit line contact and an interconnect of the bit line.

It is to be understood that both the foregoing general description and the following detailed description are exemplary and explanatory only and are not restrictive of the invention, as claimed.

DESCRIPTION OF THE PREFERRED EMBODIMENTS

In order to have wider space for node contact alignment in prior art, the interconnect of the bit line is normally formed with a narrower width. It is hard for the process of exposure and the aligned space for the node contact is still not wide enough, thus the node contact and the bit line contact each other and cause a short.

A method of fabricating bit lines by damascene is provided in the invention. A bit line contact window is formed by damascene and a spacer is then formed on the sidewall of the trench of the interconnect. The width of the bit line and the interconnect can be reduced by the spacer without the limitation of photolithography resolution. The spacer provides an additional space to be self-aligned for patterning the node contact and when misalignment occurs on the node contact, the node contact does not make contact with the bit line and the interconnect. A preferred embodiment of fabricating bit lines by damascene of this invention is describe hereinafter, as shown in FIGS. 3A–3G.

Figure 1A:
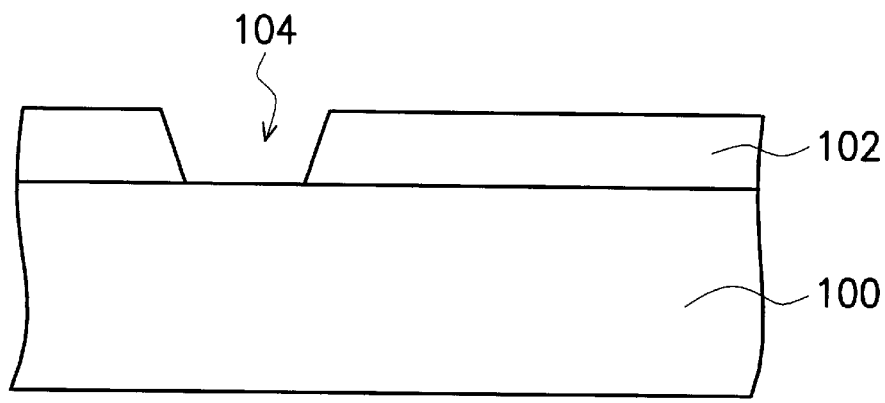
FIGS. 1A–1D are schematic, cross-sectional view illustrating fabrication of a bit line known in prior art.
Figure 1B:
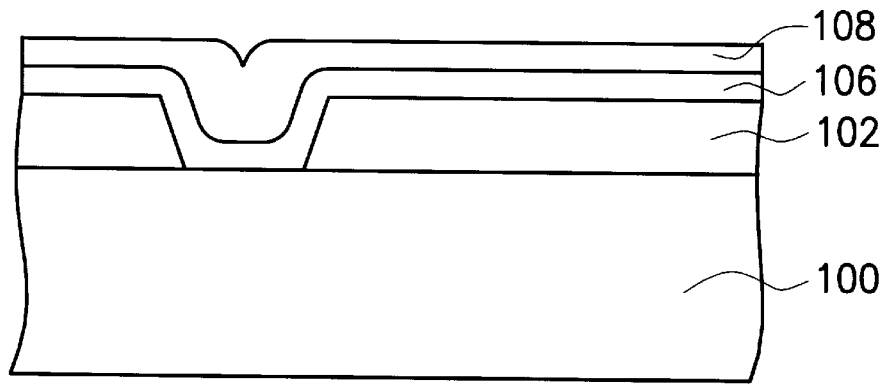
Figure 1C:
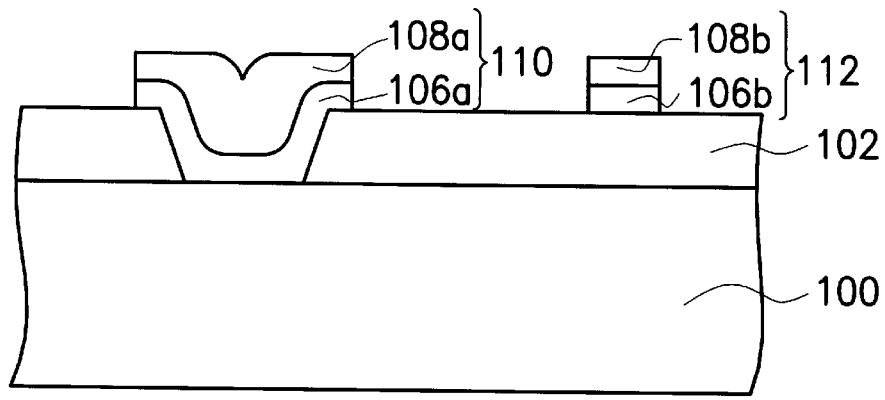
Figure 1D:
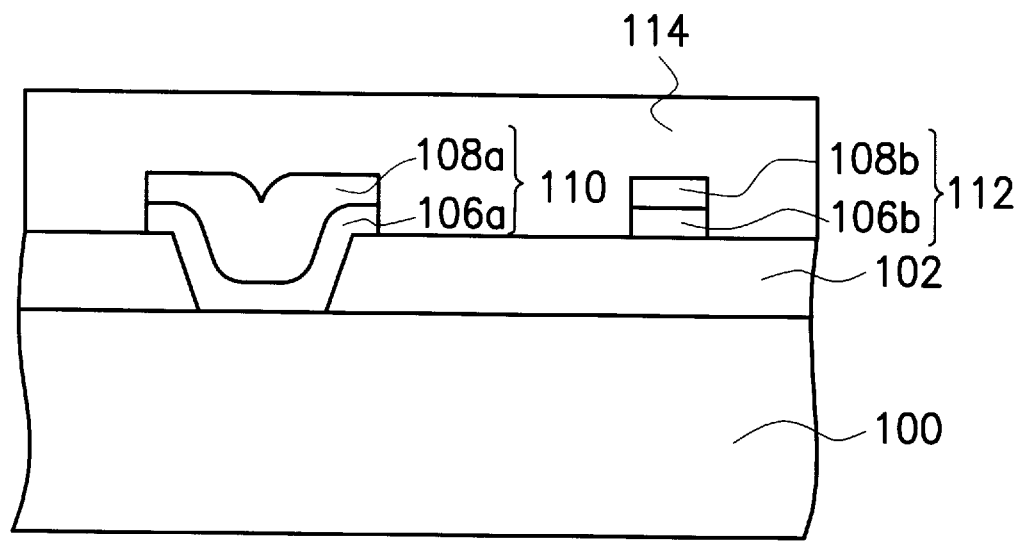
Figure 2:
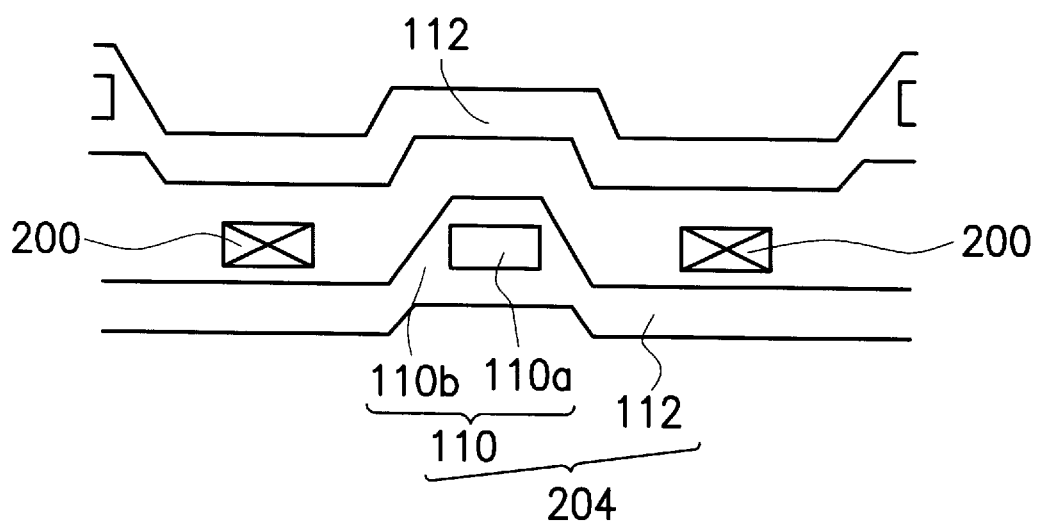
FIG. 2 is a schematic, top view of FIG. 1D.
Figure 3A:
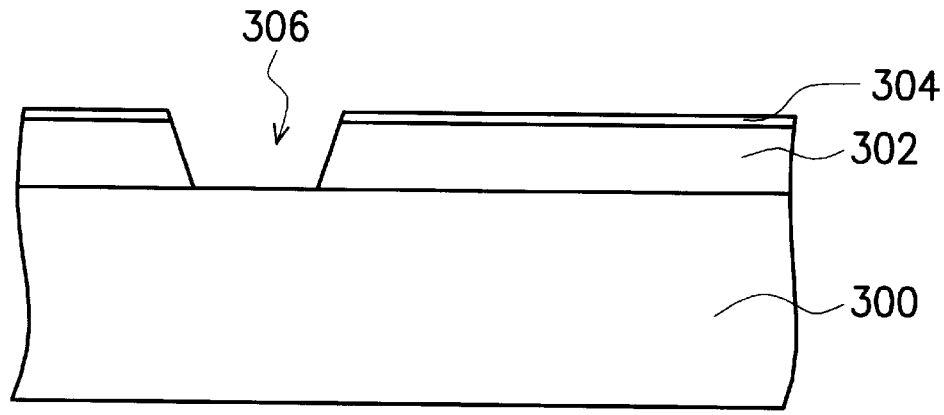
FIGS. 3A–3G are schematic, cross-sectional view illustrating fabrication of a bit line in a preferred embodiment according to the invention.

Referring to FIG. 3A, isolation structure and word lines (not shown) are formed on the substrate 300. A dielectric layer 302, such as an oxide layer, is formed on the substrate 300 by chemical vapor deposition (CVD) and covers the word lines. A hard material layer 304 is formed on the dielectric layer 302. The hard material layer 304 includes a silicon nitride layer and it is formed by CVD. A bit line contact window 306 is formed within the hard material layer 304 and the dielectric layer 302 by photolithography and the substrate 300 is exposed. Ions are implanted into the exposed substrate 300 to reduce the contact resistance of the substrate 300 and the conductive layer deposited subsequently.

Figure 3B:
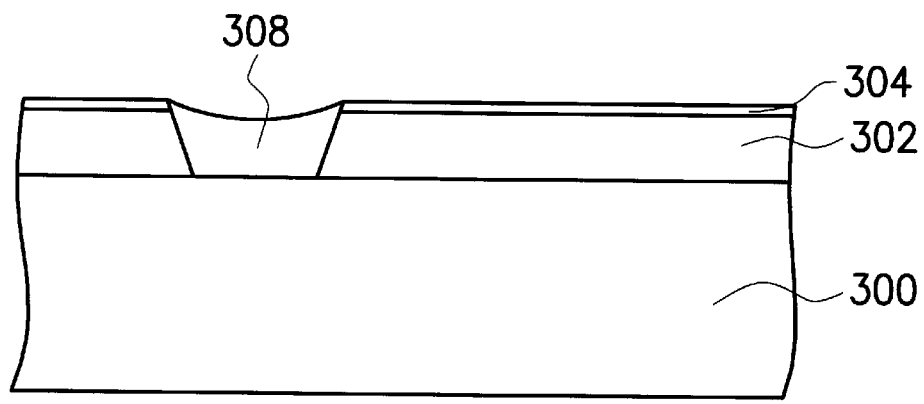

A conductive layer is then formed on the hard material layer 304, fills the bit line contact 306 and expands on the hard material layer 304. Using the hard material layer 304 as a stop layer, the conductive layer is etched back to expose the hard material layer 304, and a conductive layer 308 serving as a bit line contact shown in FIG. 3B is formed which is filled into the bit line contact window 306 of FIG. 3A. The contact resistance between the conductive layer 308 and the substrate 300 is reduced by implanting ions into the substrate 300 of foregoing step.

Figure 3C:
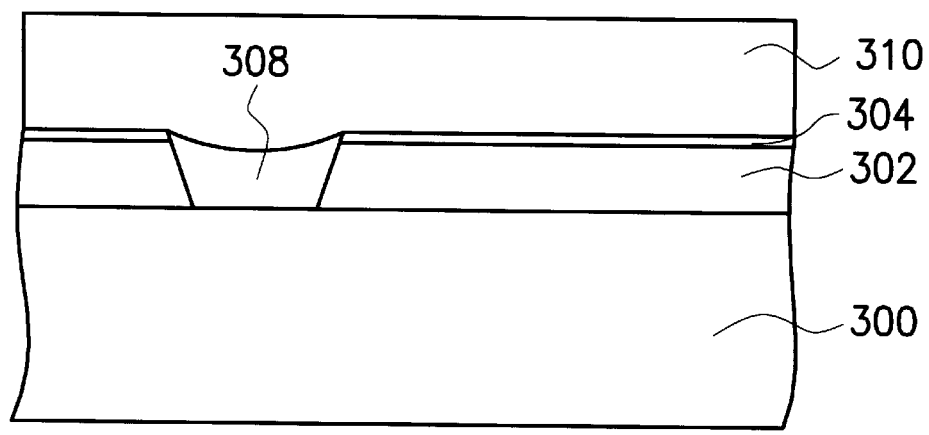
Figure 3D:
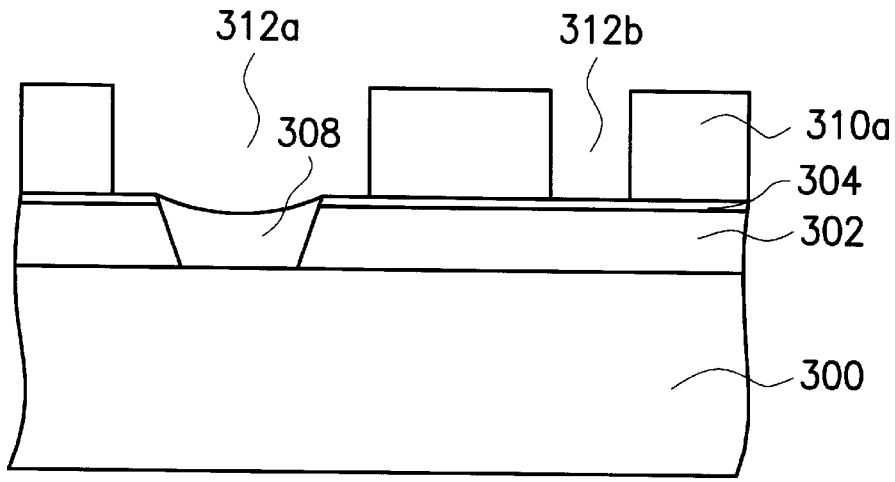

As shown in FIG. 3C, a dielectric layer 310, such as a silicon oxide layer deposited by CVD, is formed on the hard material layer 304 and the conductive layer 308. Referring to FIG. 3D, an opening 312$a$ and a trench 312$b$ are formed within the dielectric layer 310$a$ by patterning the dielectric layer 310$a$. The conductive layer 308 and a portion of the hard material layer 304 are exposed in the opening 312$a$ and the hard material layer 304 is exposed in the trench 312$b$.

The opening 312a and the trench 312b are filled with a conductive layer in subsequent process to serve as a portion of the bit line on the bit line contact 308 and a interconnect of the bit line, respectively. In order to have enough space for node contact alignment, it is necessary to provide a trench with narrower width. The conductive layer 308 fills the bit line contact to provide a more planar surface, and thus the opening 312a and the trench 312b can be formed easily during the step of exposure. In this manner, the bit line formed subsequently by depositing a conductive layer has an even topography and the resistance of the bit line can be reduced.

Figure 3E:
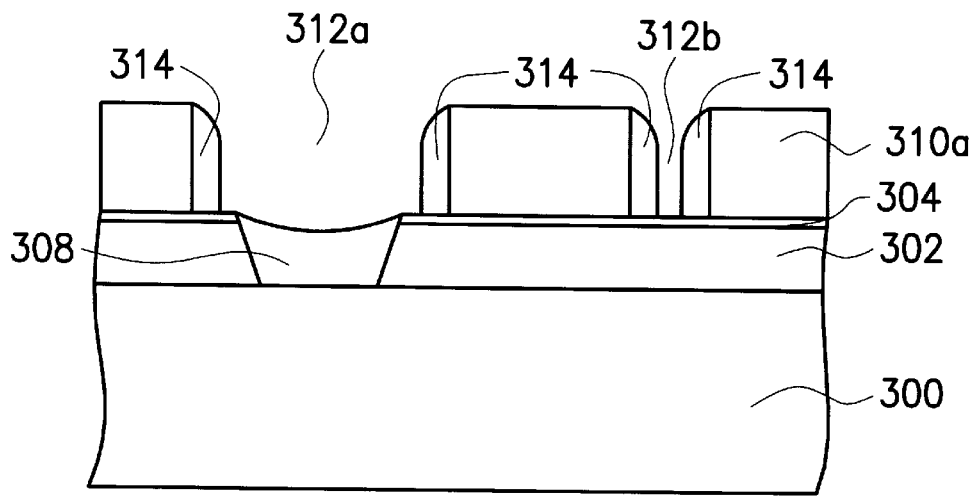
Figure 3F:
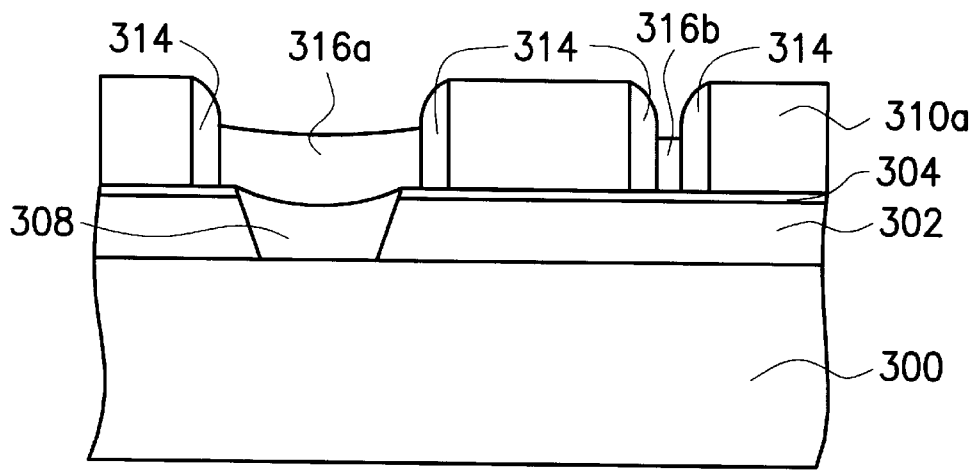

A hard material layer is then formed over the substrate 300 and etched back to form a hard material spacer on the sidewall of the opening 312a and the trench 312b to expose the conductive layer 308 and the hard material layer 304. as shown in FIG. 3E. Referring to FIG. 3F, a conductive layer is deposited and etched back to form a conductive layer 316a on the bit line contact 308 within the opening and a conductive layer 316b within the trench. The conductive layer 316a on the bit line contact 308 serves as a portion of the bit line, and the conductive layer 316b is used as an interconnect of the bit line. The conductive layer 316a, 316b including a tungsten silicide is formed by low-pressure chemical vapor deposition (LPDCVD).

Figure 3G:
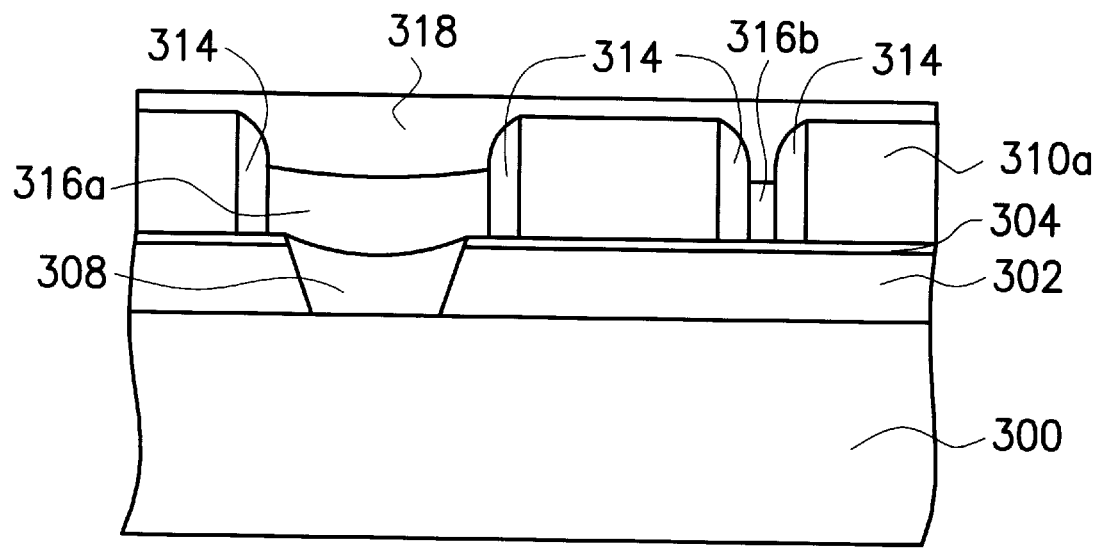

Referring to FIG. 3G, a dielectric layer 318 is formed over the substrate 300 and planarized by a process such as chemical mechanical polishing (CMP) to offer an even surface for subsequent process. The dielectric layer includes borophosphosilicate glass (BPSG).

Figure 4:
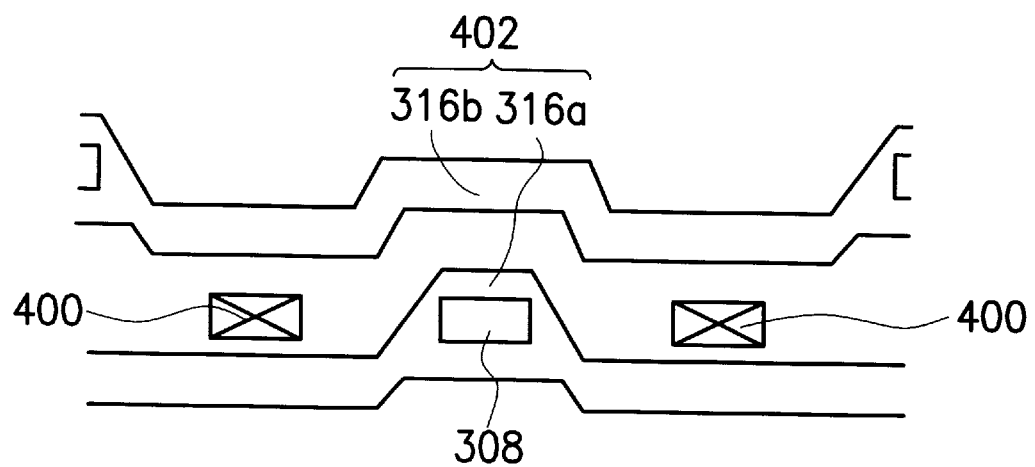
FIG. 4 is a schematic, top view of FIG. 3G.

FIG. 4 is a top view of FIG. 3G. It is desired to form an interconnect 316b with narrower width for increasing the alignment spacer of the node contact and avoiding contact with the bit line 316a on the bit line contact 308. However, the fabrication with reduced interconnect size is more difficult. Therefore, the bit line 402 fabricated by damascene is provided in this invention to increase the exposure space to be aligned, so that the node contact does not contact with the bit line 402 due to the hard material spacer, even when misalignment occurred on the node contact window.

In addition, the integration of bit lines in periphery circuitry is denser than that in the memory cell region. The topography between the periphery circuitry and the memory cell region is not even after planarizing the dielectric layer covering the bit lines in prior art, such that the subsequent processes are hard to perform. The bit lines formed by damascene solve the problem and a planar surface of the dielectric layer is therefore provided.

In prior art, the bit line is composed of a polysilicon layer and a tungsten silicide, such that the bit line is thicker and has a higher surface level. In this invention, the bit line contact window fills a polysilicon layer and the bit line is tungsten silicide. The height of the bit line is reduced and the surface level of the memory cell region is thus lowered. The problem of topography can be overcome.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating bit lines by damascene, comprising:

providing a substrate having a first dielectric layer;

forming a first hard material layer on the first dielectric layer;

patterning the first hard material layer and the first dielectric layer to form a bit line contact window in the first dielectric layer and the first hard material layer, so as to expose a portion of the substrate;

forming a first conductive layer in the bit line contact window to serve as a bit line contact;

forming a second dielectric layer over the first hard material layer;

patterning the second dielectric layer to form an opening in the second dielectric layer to expose the first conductive layer in the bit line contact window and a portion of the first hard material layer;

forming a hard material spacer on each sidewall of the opening of the second dielectric layer; and forming a second conductive layer in the opening to serve as the bit line.

2. The method according to claim 1, wherein the material of the first conductive layer includes polysilicon.

3. The method according to claim 1, wherein the material of the second conductive layer includes tungsten silicide.

4. The method according to claim 1, wherein the material of the first hard material layer includes silicon nitride.

5. The method according to claim 1, wherein the material of the hard material spacer includes silicon nitride.

6. The method according to claim 1, wherein after the step of patterning the first hard material layer and the first dielectric layer, the method further comprises performing an ion implantation step on the exposed portion of the substrate.

7. The method according to claim 1, wherein the step of forming the hard material spacer comprises forming a second hard material layer over the substrate; and etching back the second hard material layer, using the second dielectric layer as an etching stop, to form the hard material spacer.

8. A method of fabricating an interconnect of a bit line by damascene, comprising:

providing a substrate having a first dielectric layer;

forming a first hard material layer on the first dielectric layer;

forming a second dielectric layer on the first hard material layer;

forming a trench in the second dielectric layer by patterning the second dielectric layer;

forming a hard material spacer on each sidewall of the trench of the second dielectric layer; and forming a conductive layer in the trench to serve as the interconnect of the bit line.

9. The method according to claim 8, wherein the material of the conductive layer includes tungsten silicide.

10. The method according to claim 8, wherein the material of the first hard material layer includes silicon nitride.

11. The method according to claim 8, wherein the material of the hard material spacer includes silicon nitride.

12. A method of fabricating a bit line with a damascene structure, wherein a substrate having a first dielectric layer is provided, a bit line contact opening is formed in the first dielectric layer, a hard material layer is formed on the first dielectric layer to expose the bit line contact opening; the method comprising:

forming a second dielectric layer on the hard material layer;

forming an opening and a trench in the second dielectric layer wherein the opening exposes the bit line contact opening and a portion of the hard material layer and the trench exposes the hard material layer;

forming a hard material spacer on each sidewall of the opening and the trench; and forming a conductive layer in the opening and the trench to serve as the bit line.

* * * * *